(12) United States Patent
Nakayama et al.

(10) Patent No.: US 6,496,785 B1
(45) Date of Patent: Dec. 17, 2002

(54) NETWORK ANALYZER, NETWORK ANALYTICAL METHOD AND RECORDING MEDIUM

(75) Inventors: Yoshikazu Nakayama, Tokyo (JP); Norio Arakawa, Tokyo (JP)

(73) Assignee: Advantest Corporation, Tokyo (JP)

( * ) Notice: Subject to any disclaimer, the term of this patent is extended or adjusted under 35 U.S.C. 154(b) by 89 days.

(21) Appl. No.: 09/620,063

(22) Filed: Jul. 20, 2000

(30) Foreign Application Priority Data

Nov. 25, 1999 (JP) .......................... 11-333951

(51) Int. Cl.[7] .............................. G06F 19/00
(52) U.S. Cl. ................ 702/117; 324/601; 702/107
(58) Field of Search ................ 702/85, 90, 107, 702/117, 119, 120; 324/601, 615, 638

(56) References Cited

U.S. PATENT DOCUMENTS

| 5,321,364 | A | * | 6/1994 | Nukiyama et al. ........... 324/601 |
| 5,748,506 | A | | 5/1998 | Bockelman |
| 5,784,299 | A | * | 7/1998 | Evers et al. .................. 702/85 |
| 6,188,968 | B1 | * | 2/2001 | Blackham ..................... 702/85 |

FOREIGN PATENT DOCUMENTS

| EP | 0626588 A1 | 11/1994 |
| GB | 2337604 A | 11/1999 |
| JP | 11038054 A | 2/1999 |

OTHER PUBLICATIONS

Tom Dhaene, Luc Martens, Daniel De Zutter, Calibration and Normalization of Time Domain Network Analyzer Measurements, Apr. 1994, IEEE Transactions on Microwave Theory and Techniques, vol. 42, No. 4.*

* cited by examiner

*Primary Examiner*—Patrick Assouad
(74) *Attorney, Agent, or Firm*—Lowe Hauptman Gilman & Bener, LLP (57) ABSTRACT

A network analyzer includes a raw data measuring portion for measuring an S parameter of a device under test, a measuring-system error-factor measuring portion for obtaining measuring-system error factors occurring in the measurement of the device under test, a parameter conversion factor calculating portion for obtaining a parameter conversion factor indicative of the relationship between impedance and measuring system error-factor-free data obtained by eliminating measuring-system error factors from the S parameter, an extended error-factor calculating portion for obtaining extended error factors by combining the measurement-system error factors and the parameter conversion factor, and a device-under-test calculating portion for obtaining the impedance from the S parameter and the extended error factors. Accordingly, the need for fixtures is eliminated and, further, the extended error factors are obtained in advance. Therefore, operation of the network analyzer can be simplified and the calculating speeds increased.

14 Claims, 10 Drawing Sheets

$$S11m = Ed + \frac{Er \cdot S11a}{Es(S11m - Ed) + Er}$$

Figure (E)
(PRIOR ART)

$$S11a = \frac{S11m - Ed}{Es(S11m - Ed) + Er}$$

$$Z = \frac{1 + S11}{1 - S11} Z_0$$

NETWORK ANALYZER, NETWORK ANALYTICAL METHOD AND RECORDING MEDIUM

BACKGROUND OF THE INVENTION

1. Field of the Invention

The present invention relates to a network analyzer for calculating and measuring a circuit parameter of a device under test.

2. Description of the Related Art

There have been two practiced methods for measuring various circuit parameters of a device under test such as, for example, an S parameter of an arbitrary normalized impedance, an S parameter in the case where a matching circuit is added, and the circuit impedance.

Figure 10:
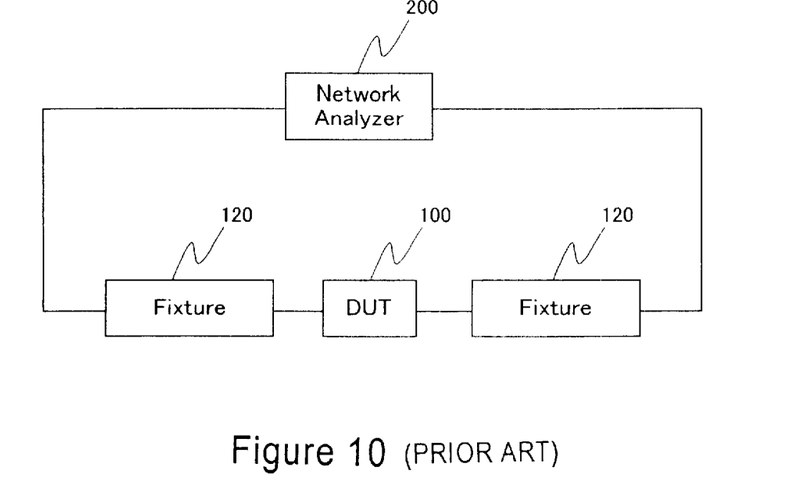
FIG. 10 is a block diagram showing a conventional arrangement used for measuring a circuit parameter with a fixture attached to a device under test.

A first method is to connect a fixture to a device under test so that a desired circuit parameter is directly measured. In FIG. 10 is shown a system configuration of a device under test connected to a fixture. In the first method shown in FIG. 10, the fixture 120 is connected to a device under test 100 and the device under test 100, together with the fixture 120, is measured by the network analyzer 200.

In this case, the circuit parameters of the device under test 100 vary with the fixture 120. Therefore, in order to obtain the circuit parameters under given conditions, the measurement is carried out by fabricating a fixture 120 satisfying the given conditions and connecting it to the device under test 100. When, for example, it is desired to obtain circuit parameters for ten kinds of conditions, ten fixtures 120 may be fabricated and then ten measurement, may be performed by connecting each fixture to the device under test 100.

A second method is carried out as follows: raw data of the device under test (for example, an S parameter) is first measured. Then, the measured raw data is substituted into a relational expression between a desired circuit parameter and the raw data to thereby obtain the desired circuit parameter.

The second method will be described below by taking a measurement of the impedance of a device under test as an example. First, the impedance Z is expressed as the numerical expression in FIG. 11, where Ed is an error mainly due to the directivity of the bridge, Er is an error mainly due to the frequency tracking, and Es is an error mainly due to the source matching.

Figure 11:
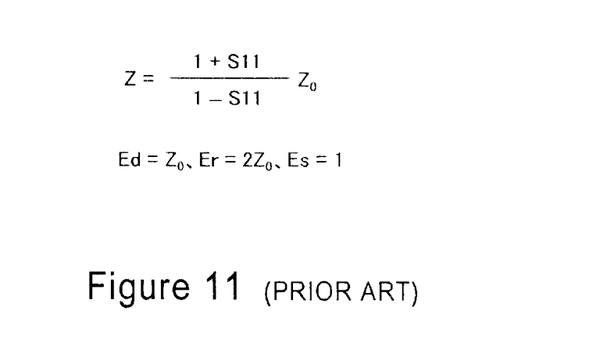
FIG. 11 is a numerical expression for obtaining an impedance Z.
Figure 12:
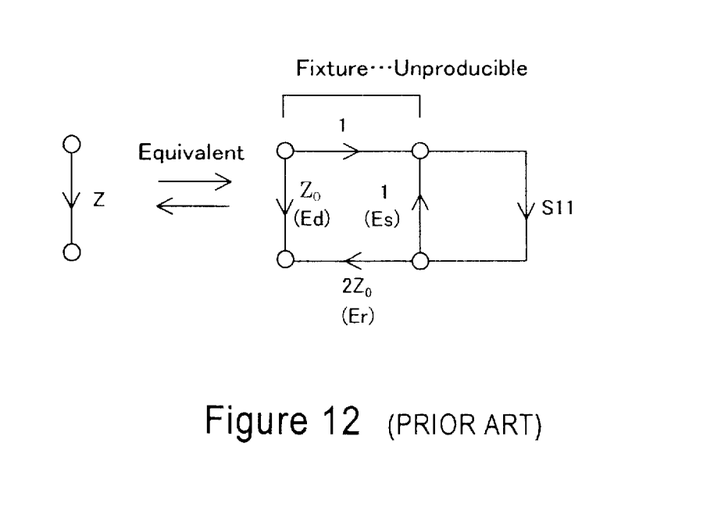
FIG. 12 is a representation in a signal flow graph of the numerical expression for obtaining the impedance Z.

When the numerical expression of FIG. 11 is represented by a signal flow graph, FIG. 12 is obtained. S11 denotes the raw data to be measured. By substituting this into the numerical expression of FIG. 11, the impedance Z can be obtained.

The second method can be effectively used when it is difficult or impossible, in principle, to fabricate a fixture. In the case shown in FIG. 12, for example, the impedance may be measured if the portion in the center of the right-hand side can be fabricated as a fixture. However, it is impossible to fabricate such a fixture in principle. The second method is therefore used for obtaining the impedance.

SUMMARY OF THE INVENTION

However the first method has the following defects. First of all, it is troublesome to fabricate a variety of fixtures and it is also troublesome to repeat measurements many times. It is also difficult to fabricate fixtures having ideal characteristics. Further, when a plurality of fixtures for the same purpose are fabricated, it is difficult to fabricate them with uniform characteristics. Furthermore, depending on circuit parameters to be measured, there are cases where fabrication of the fixtures is impossible in principle.

On the other hand, the second method, it is relatively easy to solve the above mentioned problems related to fabrication of fixtures. However, a long time is taken for calculation and this prolongs the totally required measuring time.

Accordingly, an object of the present invention is to provide a network analyzer whereby various circuit parameters of a device under test can be obtained simply.

According to the present invention, a network analyzer for calculating a circuit parameter of a device under test may include: a raw data measurement means for measuring raw data of the device under test; a measuring-system error-factor measurement means for obtaining measuring system error factors occurring in the measurement of the device under test; a parameter conversion factor calculation means for obtaining factors of parameter conversion indicative of the relationship between the circuit parameter and measuring-system error-factor-free data obtained by eliminating the measuring-system error factors from the raw data; a true-value raw data calculation means for obtaining the measuring-system error-factor-free data from the raw data and the measuring-system error factors; and a device-under-test calculation means for obtaining the circuit parameter from the measuring-system error-factor-free data and the parameter conversion factor.

The term "raw data" as used herein means the data directly measured by a network analyzer. An example of the raw data is an S parameter. Factors of errors occurring in the measurement system include an error attributable to the directivity of a bridge, an error attributable to the frequency tracking, and an error attributable to the source matching. An example of the circuit parameter is an impedance. An example of factors of parameter conversion is the relationship between an S parameter and the impedance.

According to the present invention, a circuit parameter can be obtained from raw data, factors of errors in the measurement system, and factors of parameter conversion. Therefore, when a circuit parameter is connected to a device under test, the circuit parameter can be calculated without fabricating any fixtures and repeating many times of measurement with the fixtures changed each time. Hence, a circuit parameter can be calculated simply.

The present invention may include a network analyzer as noted above, wherein the measurement means treats the raw data as the measuring-system error-factor-free data.

In the case where the measuring-system error-factor can be neglected, the raw data of the device-under-test may be treated as the measuring-system error-factor-free data.

According to the present invention, a network analyzer for calculating a circuit parameter of a device under test may include: a raw data measurement means for measuring raw data of the device under test; a measuring-system error-factor measurement means for obtaining measuring-system error factors occurring in the measurement of the device under test; a parameter conversion factor calculation means for obtaining factors of parameter conversion indicative of the relationship between the circuit parameter and measuring-system error-factor-free data obtained by eliminating the measuring-system error factors from the raw data; an extended error-factor calculation means for obtaining extended error factors by combining the measuring-system error factors and the parameter conversion factor; and a device-under-test calculation means for obtaining the circuit parameter from the raw data and the extended error factors.

According to the present invention, a circuit parameter can be obtained from raw data, factors of errors in the measurement system, and factors of parameter conversion. Therefore, when a fixture is connected to a device under test, the circuit parameter can be calculated without fabricating any fixtures and repeating measurements many times with the fixtures changed each time. Hence, a circuit parameter can be calculated simply.

Furthermore, the error factor calculation means obtains the extended error factors in advance by combining the error factors occurring in the measurement system and the factors of parameter conversion. Therefore, calculation speed can be improved.

According to the present invention, a network analyzer as noted above, may further include a parameter conversion factor record means for recording the parameter conversion factor.

The present invention may include a network analyzer as noted above, wherein the circuit parameter is an impedance.

The present invention may include a network analyzer as noted above, wherein the circuit parameter is an S parameter as an arbitrary normalized impedance.

The present invention may include a network analyzer as noted above, wherein the circuit parameter is an S parameter when a matching circuit is added.

The present invention may include a network analyzer as noted above, wherein the circuit parameter is a circuit admittance.

According to the present invention, a network analytical method of calculating a circuit parameter of a device under test may include: a raw data measurement step for measuring raw data of the device under test; a measuring-system error-factor measurement step for obtaining measuring-system error factors occurring in the measurement of the device under test; a parameter conversion factor calculation step for obtaining factors of parameter conversion indicative of the relationship between the circuit parameter and measuring-system error-factor-free data obtained by eliminating the measuring-system error factors from the raw data; a true-value raw data calculation step for obtaining the measuring-system error-factor-free data from the raw data and the measuring-system error factors; and a device-under-test calculation step for obtaining the circuit parameter from the measuring-system error-factor-free data and the parameter conversion factor.

According to the present invention, a network analytical method of calculating a circuit parameter of a device under test may also include: a raw data measurement step for measuring raw data of the device under test; a measuring-system error-factor measurement step for obtaining measuring-system error factors occurring in the measurement of the device under test; a parameter conversion factor calculation step for obtaining factors of parameter conversion indicative of the relationship between the circuit parameter and measuring-system error-factor-free data obtained by eliminating the measuring-system error factors from the raw data; an extended error-factor calculation step for obtaining extended error factors by combining the measuring-system error factors and the parameter conversion factor; and a device-under-test calculation step for obtaining the circuit parameter from the raw data and the extended error factors.

According to the present invention, a computer-readable medium embodying a program of instructions for execution by the computer to perform a network analytical method of calculating a circuit parameter of a device under test may include: a raw data measurement step for measuring raw data of the device under test; a measuring-system error-factor measurement step for obtaining measuring-system error factors occurring in the measurement of the device under test; a parameter conversion factor calculation step for obtaining factors of parameter conversion indicative of the relationship between, the circuit parameter and measuring-system error-factor-free data obtained by eliminating the measuring-system error factors from the raw data; a true-value raw data calculation step for obtaining the measuring-system error-factor-free data from the raw data and the measuring-system error factors; and a device-under-test calculation step for obtaining the circuit parameter from the measuring-system error-factor-free data and the parameter conversion factor.

According to the present invention, a computer-readable medium embodying a program of instructions for execution by the computer to perform a network analytical method of calculating a circuit parameter of a device under test may include: a raw data measurement step for measuring raw data of the device under test; a measuring-system error-factor measurement step for obtaining measuring-system error factors occurring in the measurement of the device under test; a parameter conversion factor calculation step for obtaining factors of parameter conversion indicative of the relationship between the circuit parameter and measuring-system error-factor-free data obtained by eliminating the measuring-system error factors from the raw data; an extended error-factor calculation step for obtaining extended error factors by combining the measuring-system error factors and the parameter conversion factor; and a device-under-test calculation step for obtaining the circuit parameter from the raw data and the extended error factors.

According to the present invention, a network analyzer for calculating a circuit parameter of a device under test may also include: a raw data measurement device that measures raw data of the device under test; a measuring-system error-factor measurement device that obtains measuring-system error factors occurring in the measurement of the device under test; a parameter conversion factor calculation device that obtains factors of parameter conversion indicative of the relationship between the circuit parameter and measuring-system error-factor-free data obtained by eliminating the measuring-system error factors from the raw data; a true-value raw data calculation device that obtains the measuring-system error-factor-free data from the raw data and the measuring-system error factors; and a device-under-test calculation device that obtains the circuit parameter from the measuring-system error-factor-free data and the parameter conversion factor.

According to the present invention, a network analyzer for calculating a circuit parameter of a device under test may lastly include: a raw data measurement device that measures raw data of the device under test; a measuring-system error-factor measurement device that obtains measuring-system error factors occurring in the measurement of the device under test; a parameter conversion factor calculation device that obtains factors of parameter conversion indicative of the relationship between the circuit parameter and measuring-system error-factor-free data obtained by eliminating the measuring-system error factors from the raw data; an extended error-factor calculation device that obtains extended error factors by combining the measuring-system error factors and the parameter conversion factor; and a device-under-test calculation device that obtains the circuit parameter from the raw data and the extended error factors.

BRIEF DESCRIPTION OF THE DRAWINGS

FIGS. 5(A)–5(E) are diagrams showing a method of measuring Ed, Er, and Es as measuring-system error factors.

DESCRIPTION OF THE PREFERRED EMBODIMENTS

An embodiment of the invention will be described with reference to the accompanying drawings.

First Embodiment

Figure 1:
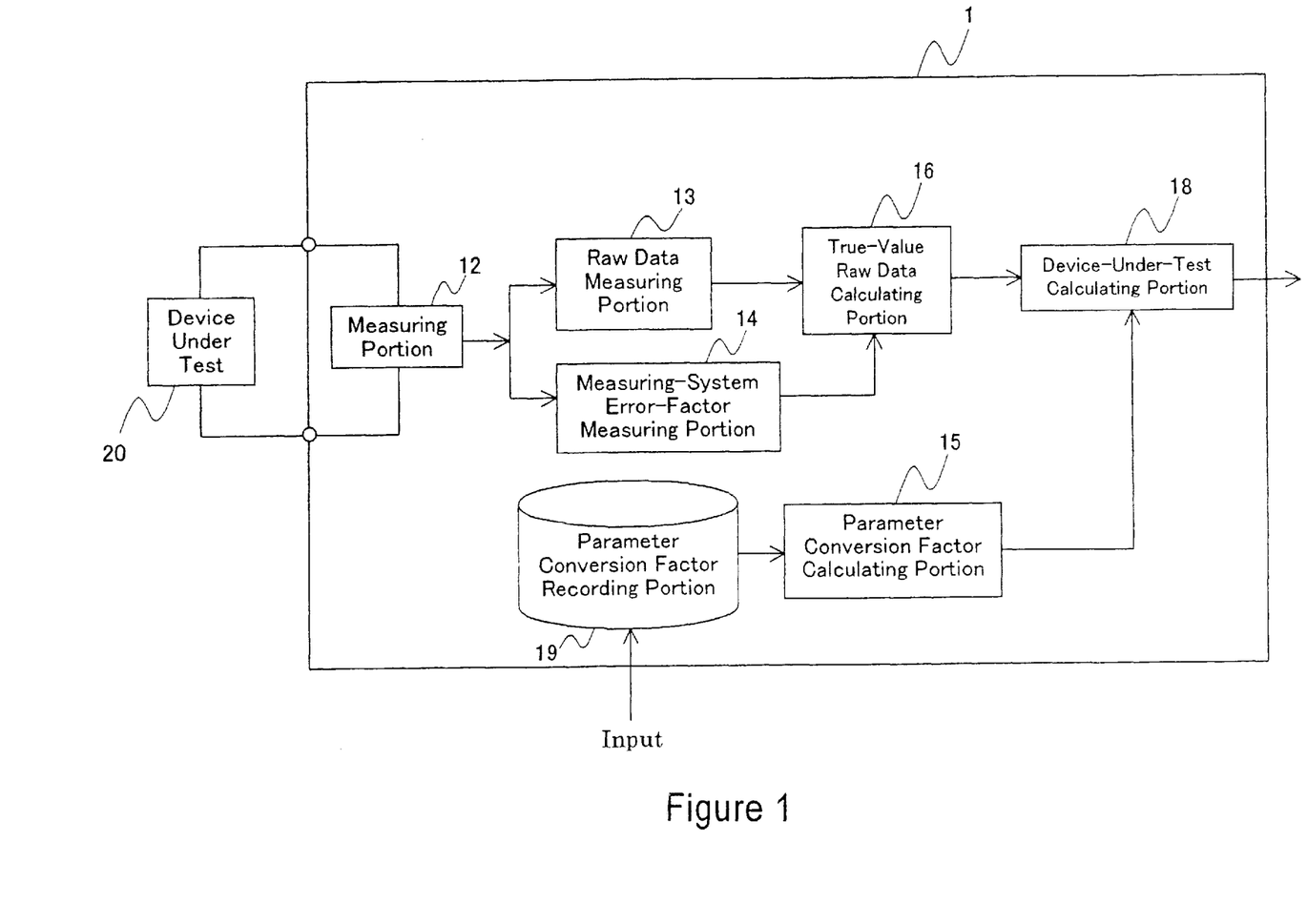
FIG. 1 is a block diagram showing structure of a network analyzer 1 according to a first embodiment of the invention.

First, the structure of a network analyzer 1 according to a first embodiment of the invention will be described. FIG. 1 is a block diagram showing the network analyzer 1 according to the first embodiment.

The network analyzer 1 comprises a measuring portion 12, a raw data measuring portion 13, a measuring-system error-factor measuring portion 14, a parameter conversion factor calculating portion 15, a true-value raw data calculating portion 16, a device-under-test calculating portion 18, and a parameter conversion factor recording portion 19.

The measuring portion 12 is connected to the device under test 20 and obtains data from the device under test 20. The raw data measuring portion 13 measures raw data containing errors that are due to the measuring portion 12. The measuring-system error-factor measuring portion 14 measures the measuring-system errors that are due to the measuring portion 12. In the first embodiment, the raw data is presumed to be an S parameter and the measuring-system errors are presumed to be Ed: error attributable to the directivity of the bridge, Er: error attributable to the frequency tracking, and Es: error attributable to the source matching.

Figure 2:
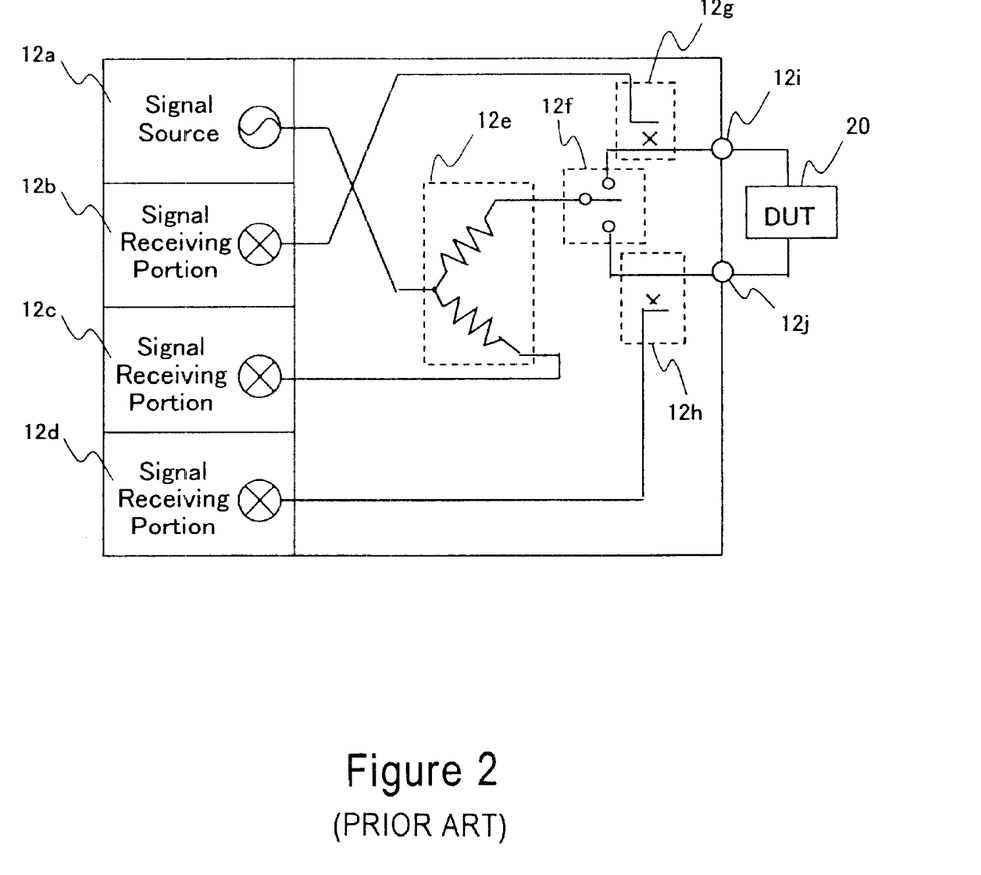
FIG. 2 is a circuit diagram showing structure of a measuring portion 12 for measuring an S parameter.

As the measuring portion 12 for obtaining data related to an S parameter, the measuring portion disclosed in Japanese Laid-open Patent No. Hei 11-38054 may be used. The structure disclosed therein is shown in FIG. 2. The signal source 12a generates a signal and a sweep generator is generally used therefor. The signal receiving portions 12b and 12d receive the generated signal at a mixer to convert the same into a low frequency signal, have the signal analog-to-digital (A/D) converted, and have the signal orthogonally detected to obtain the real value R and the imaginary value X so that the signal is measured as one complex value. The signal receiving portion 12c measures the transmitted signal from the signal source 12a. The three signal receiving portions 12b, 12c, and 12d are synchronized so that the signal of the frequency output from the signal source 12a may be detected thereby.

The power splitter 12e is a circuit for splitting the signal from the signal source 12a, one of the splitted signals being supplied to the device under test 20 through the RF switch 12f and the other being supplied to the signal receiving portion 12c. The RF switch 12f outputs the output signal from the signal source 12a either from the terminal 12i or from the terminal 12j. The reference numbers 12g and 12h represent a bridge, or a directional coupler, for taking out the response signal from the terminal 12i or the terminal 12j.

The true-value raw data calculating portion 16 obtains measuring-system error-factor-free data. In the first embodiment, the measuring-system error-factor-free data is obtained by eliminating the measuring-system error factors Ed, Er, and Es from the S parameter.

The parameter conversion factor calculating portion 15 obtains parameter conversion factor giving the relationship between the circuit parameters and the measuring-system error-factor-free data. In the first embodiment, the impedance Z is presumed to be the circuit parameter. Accordingly, the parameter conversion factor calculating portion 15 calculates the relationship between the impedance Z and the S parameter (with Ed, Er, and Es eliminated therefrom).

The device-under-test calculating portion 18 obtains the circuit parameter from the measuring-system error-factor-free data and the parameter conversion factor. In the first embodiment, the impedance Z is obtained from the S parameter (with Ed, Er, and Es eliminated therefrom) and the parameter conversion factor. Incidentally, the result of the calculation is displayed on a display device (not shown).

The parameter conversion factor recording portion 19 is for recording data for use in calculating the parameter conversion factor. The data for calculating the parameter conversion factor can be input to the parameter conversion factor recording portion 19. Generally, there are stored therein formulas for mutual conversion of various circuit parameters (for example, formulas for conversion between S parameters and impedance values).

The above mentioned function can also be implemented in the form of programs. The programs are recorded on a flexible disk or a CD-ROM readable by a computer and read by a media reading device (not shown) of the network analyzer 1 to be installed on a hard disk (not shown).

Figure 3:
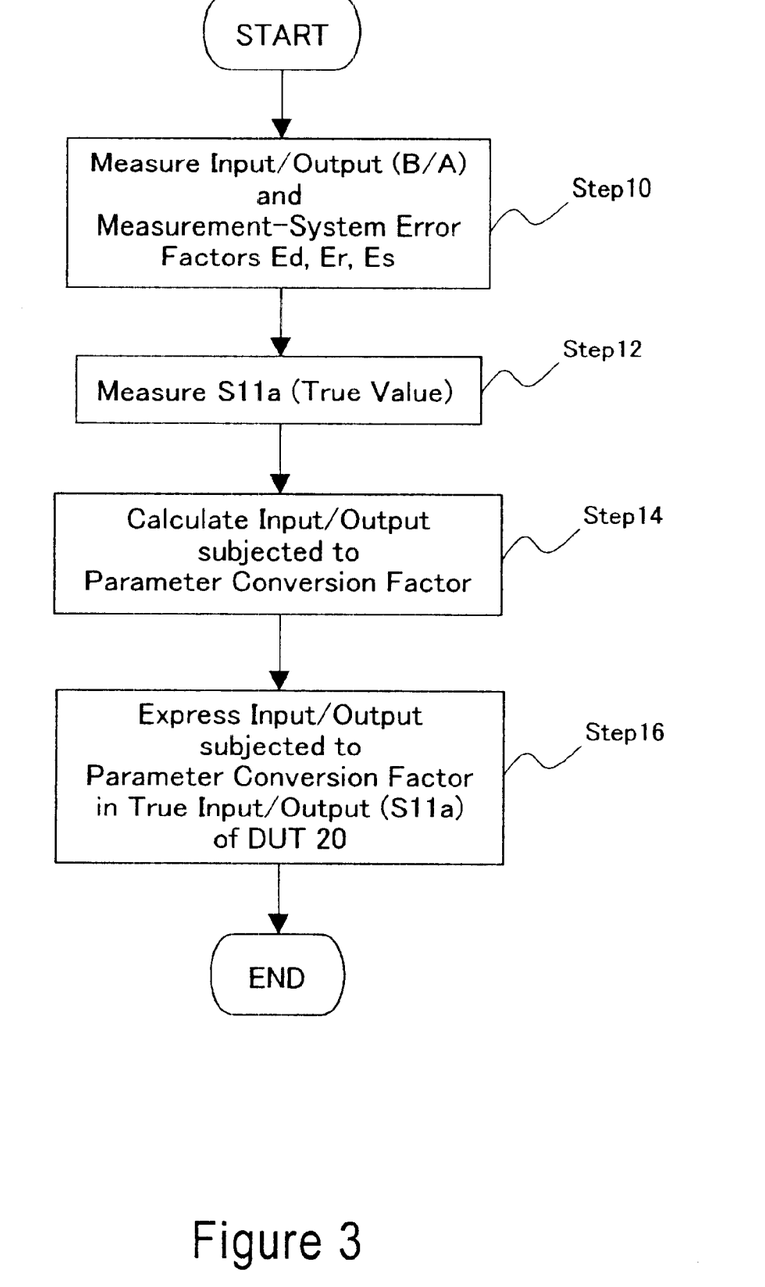
FIG. 3 is a flowchart showing procedure of operations in the network analyzer 1.
Figure 4:
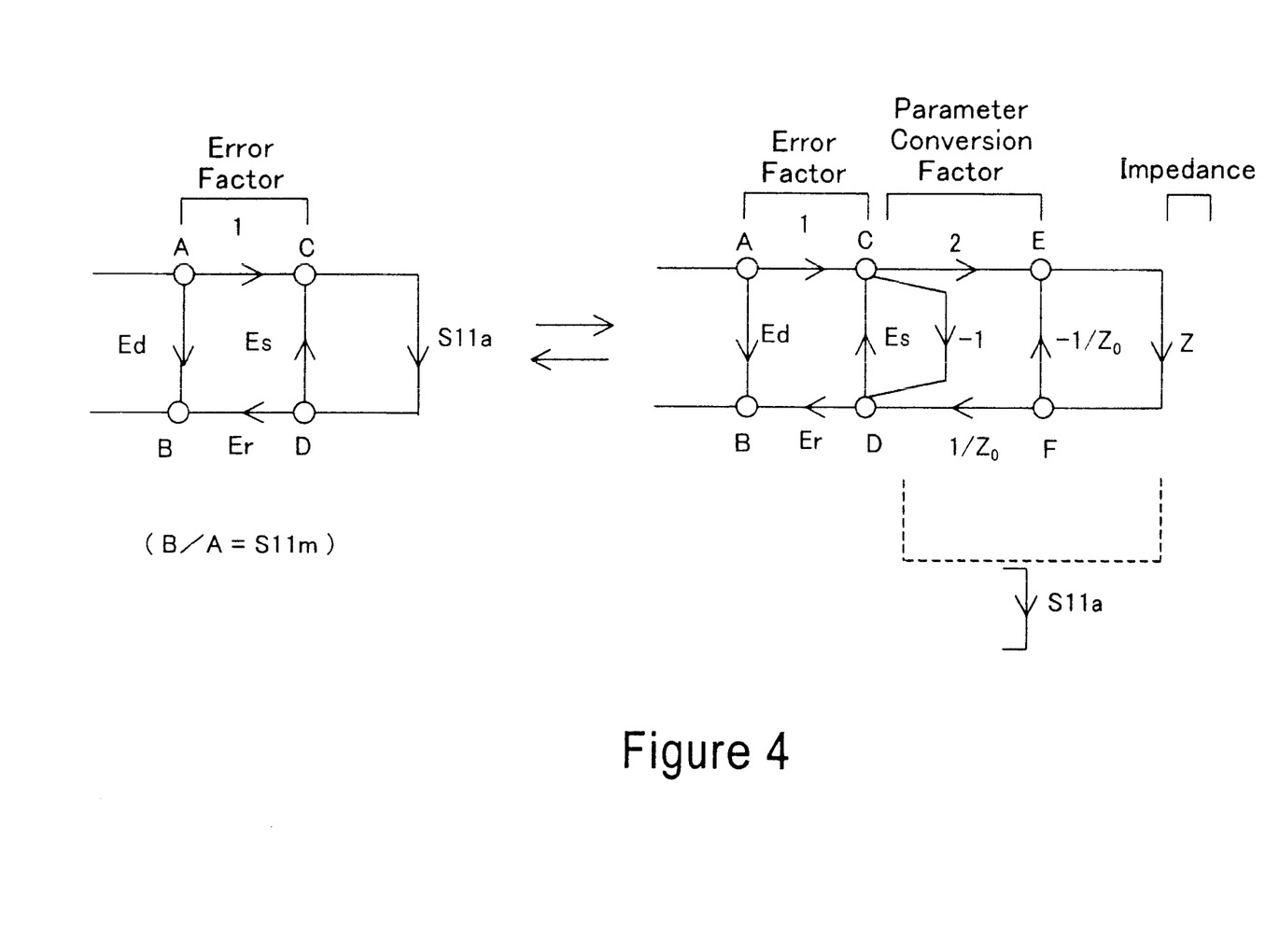
FIG. 4 is a signal flow graph giving an equivalent conversion of a device under test 20.

Now, the operation of the first embodiment of the invention will be described. FIG. 3 is a flowchart showing the procedure of operations carried out by the network analyzer 1. First, the measuring portion 12 obtains data from the device under test 20. From the data, the raw data measuring portion 13 measures the S parameter (B/A) (refer to the left-hand side of FIG. 4) as raw data and the measuring-system error-factor measuring portion 14 measures Ed, Er, and Es as measuring-system error factors (Step 10).

Figure 5A:
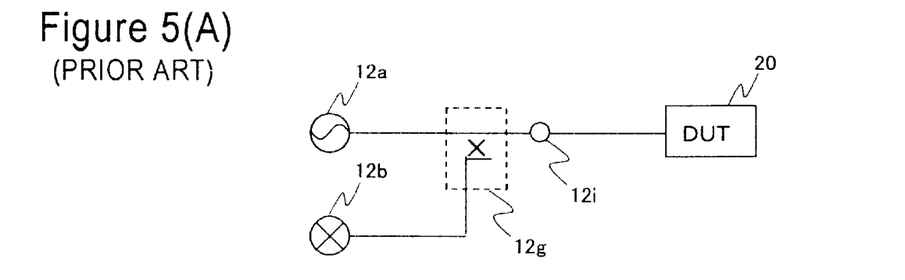

With respect to the method of measuring the measuring-system error factors Ed, Er, and Es, there is a disclosure made in Japanese Laid-open Patent Publication No. H11-38054. The explanation thereof will be made With reference to FIGS. 5(A)–5(E). FIG. 5(A) shows a measurement system for measuring the reflection characteristic of the device under test 20 in a network analyzer. A signal from the signal source 12a is supplied to the device under test 20 and the reflected signal therefrom is taken out through the bridge 12g and 12h and measured by the receiving portion 12b.

Figure 5B:
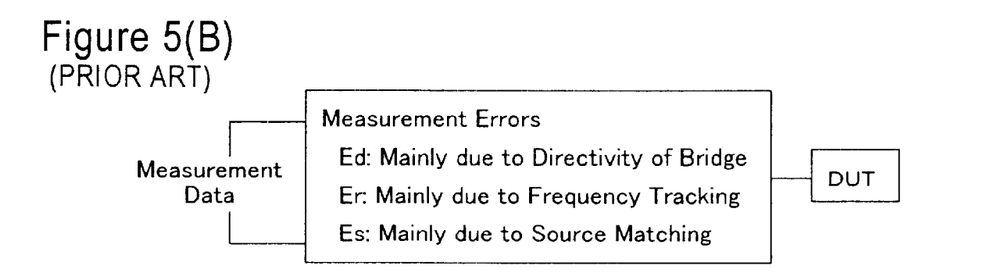

FIG. 5(B) shows the measuring-system error factors occurring in this case. Namely, the measuring-system error factors are errors caused by the directivity of the measuring-system, the frequency tracking and the source matching. While the incident signal on the device under test 20 and the reflected signal from the device under test 20 are separated by the bridge 12g and 12h, the measured value S11m includes a leakage, i.e., a leakage signal, in the forward direction, which causes the directivity error. The frequency tracking error is that due to the frequency response of the measuring system. When the impedance on the signal source side and the impedance on the measuring system side are not matched, the signal reflected from the device under test 20 is reflected again from the side of the signal source 12a and returns to the device under test 20 to be re-reflected therefrom. The source matching error is that due to this re-reflection.

Figure 5C:
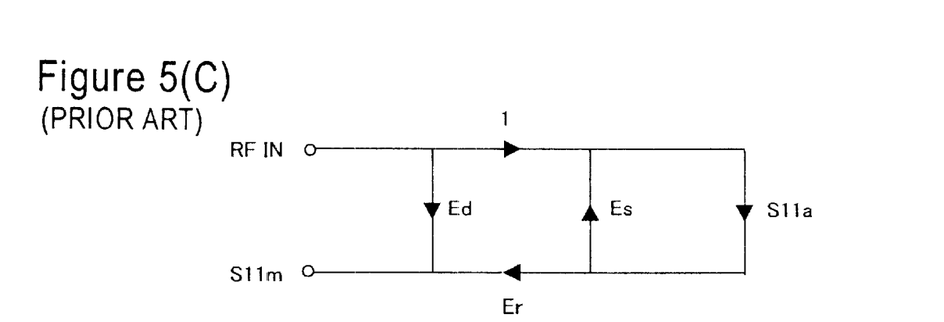
Figure 5D:
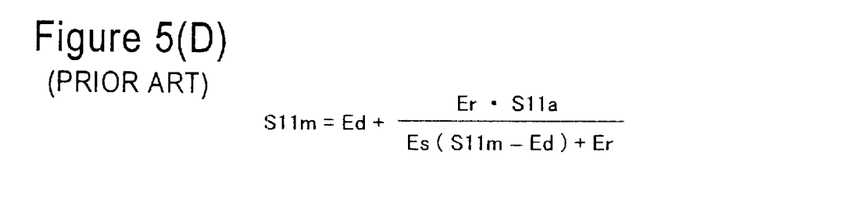

With the above described factors included, the error model in the reflection characteristic measurement of one port is given as shown in FIG. 5(C). Here, S11m denotes the measured value, S11a denotes the true value, and Ed, Er, and Es denote the error factors. When this error model is solved by means of a signal flow graph to obtain S11m (description thereof is omitted), it can be expressed as shown in FIG. 5(D). If the same is transformed to obtain the true value S11a, it can be expressed as FIG. 5(E). Since unknowns here, Ed, Er, and Es, are three in number, the unknowns can be obtained by using three standard devices whose characteristics are known.

Namely three states, i.e., "open" (open circuit), "short" (short circuit), and "load" (with a standard load Zo) are created and measured values f(short), f(open), and f tload) of S11m at each time are recorded and then calculation is made by using these values. Thereby, the true reflection coefficient S11a of the device under test 20 can be obtained. This operation is called calibration. More specifically, calibration is an operation to have the errors inherent in the measurement system measured in advance and to use them in the calculation to eliminate the effects caused thereby.

When the error factors are negligible, i.e., when it is considered that Ed=1, Er=0, and Es=1, it is possible to regard S11m (measured value) as S11a (true value).

Returning to FIG. 3, the true-value raw data calculating portion 16 obtains the true reflection coefficient S11a from the S parameter (B/A), as the raw data output from the raw data measuring portion 13, and the measuring-system error factors Ed, Er, and Es outputted from the measuring-system error-factor measuring portion 14 (Step 12). This can be performed by the use of the numerical expression in FIG. 5(E).

Figure 6:
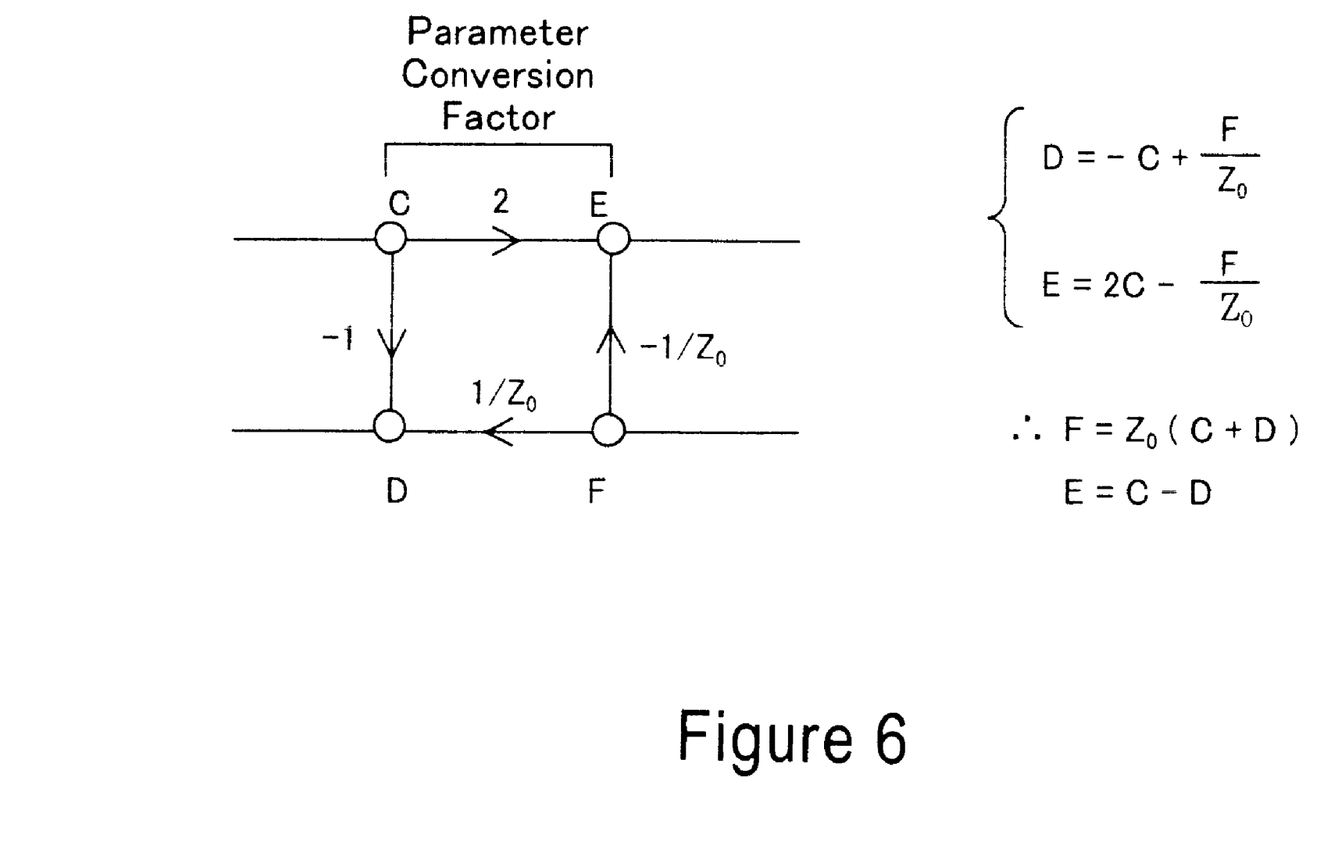
FIG. 6 is an explanatory drawing of a method of expressing the input and output before being subjected to a parameter conversion by the input and output after being subjected to the parameter conversion.

Then, the parameter conversion factor calculating portion 15 expresses the input and output subjected to the parameter conversion factor in terms of the input and output before being subjected to the parameter conversion factor (Step 14). At this time, a parameter conversion factor is read out from the parameter conversion factor recording portion 19 to be used for the calculation. An example of the calculation is shown in FIG. 6. The parameter conversion factor calculating portion 15 uses the data corresponding to the signal flow graph read out from the parameter conversion factor recording portion 19 and expresses the impedance Z (F/E), which is the input and output subjected to the parameter conversion factor, in terms of the true reflection factor S11a (D/C), which is the input and output before being subjected to the parameter conversion factor (refer to FIG. 6).

Returning to FIG. 3, the device-under-test calculating portion 18, based upon the output of the parameter conversion factor calculating portion 15 and the true reflection coefficient S11a outputted from the true-value raw data calculating portion 16, expresses the input and output subjected to the parameter conversion factor, at the time when the true reflection coefficient S11a (D/C) is applied to the parameter conversion factor, in terms of the true reflection coefficient S11a (D/C) (Step 16). A concrete example will be described with reference to the right-hand side of FIG. 4 and as well as FIG. 6. As shown in FIG. 6, the impedance Z (F/E) (subjected to the parameter conversion factor) is expressed in terms of the true reflection coefficient S11a (D/C) (before being subjected to the parameter conversion factor). It is apparent from FIG. 4 that D/C is the true reflection coefficient S11a. Thus, the impedance Z can be obtained from the true reflection coefficient S11a.

According to the first embodiment of the invention, once Ed, Er, Es, and S11a have been measured by the measuring portion 12, the raw data measuring portion 13, and the measuring-system error-factor measuring portion 14, the impedance Z when Zo is changed various ways can be obtained and, hence, the circuit parameter can be calculated simply.

Although the circuit parameter is presumed to be an impedance Z in the first embodiment, it may be such as an S parameter as a given normalized impedance, an S parameter when a matching circuit is added, or a circuit admittance. Since the relationship between an S parameter as raw data from which the measuring-system error factors Ed, Er, and Es are eliminated and an S parameter as a given normalized impedance, and the like, is well-known, no particular description will be given here. Further, though an S parameter (including measuring-system error factors Ed, Er, and Es) is considered to be raw data, this can also be another circuit parameter (impedance or the like).

While, as described above, there are various types of raw data and circuit parameters, the relationship between the measuring-system error-factor-free data, i.e., raw data from which measuring-system error factors are eliminated, and a circuit parameter is well-known. Hence, the description thereof will be omitted.

Second Embodiment

Figure 7:
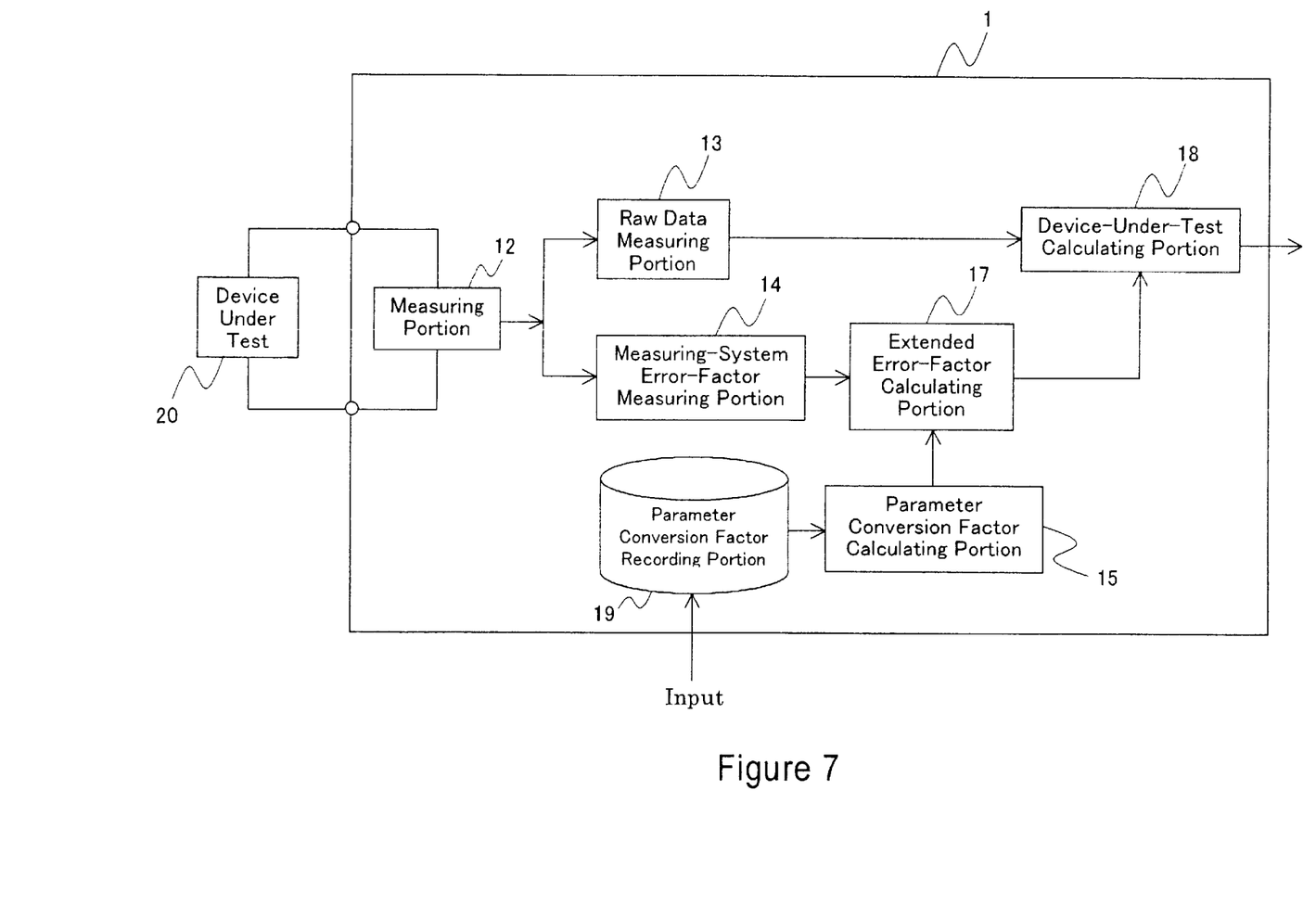
FIG. 7 is a block diagram showing structure of a network analyzer 1 according to a second embodiment.

The network analyzer 1 in the second embodiment is different from that in the first embodiment by comprising, instead of the true-value raw data calculating portion 16 therein, an extended-error-factor calculating portion 17. FIG. 7 is a block diagram showing structure of a network analyzer 1 according to the second embodiment. Denoting the portion like those of the first embodiment by corresponding reference numerals, description of the same will be omitted.

The extended-error-factor calculating portion 17 calculates an extended error factor by combining the measuring-system error factor measured by the measuring-system error-factor measuring portion 14 and the parameter conversion factor calculated by the parameter conversion factor calculating portion 15. Namely, the factor in which the measuring-system error factor and the parameter conversion factor are combined is used as a new measuring-system error factor.

The above mentioned function can also be implemented in the form of programs. The programs are recorded on a flexible disk or a CD-ROM readable by a computer and read by a media reading device (not shown) of the network analyzer 1 to be installed on a hard disk (not shown).

Figure 8:
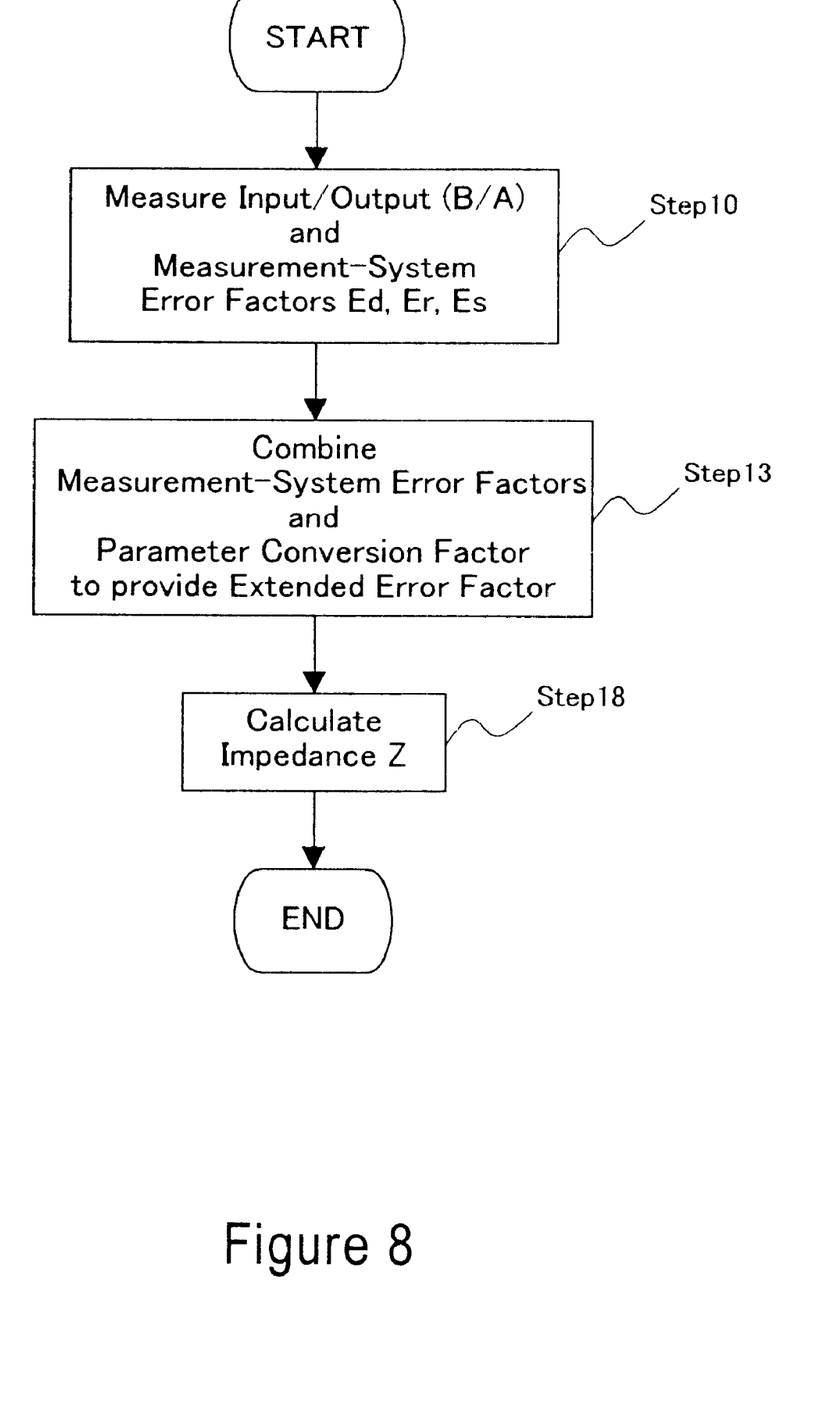
FIG. 8 is a flowchart showing procedure of operations in the network analyzer 1.

Now, the operation of the second embodiment will be described. FIG. 8 is a flowchart showing the procedure of operations performed in the network analyzer 1. First, the measuring portion 12, the raw data measuring portion 13, and the measuring-system error-factor measuring portion 14 measure, as is the case with the first embodiment, the raw data (B/A) of the device under test 20 and the measuring-system error factors, Ed, Er, and Es (refer to FIG. 8) (Step 10).

Then, the extended-error-factor calculating portion 17 sets the factor obtained by combining the extended error factor and the parameter conversion factor as the new error factor, i.e., the extended error factor (Step 13). Operation of the extended error-factor calculating portion 17 will be described with reference to FIG. 9.

Figure 9:
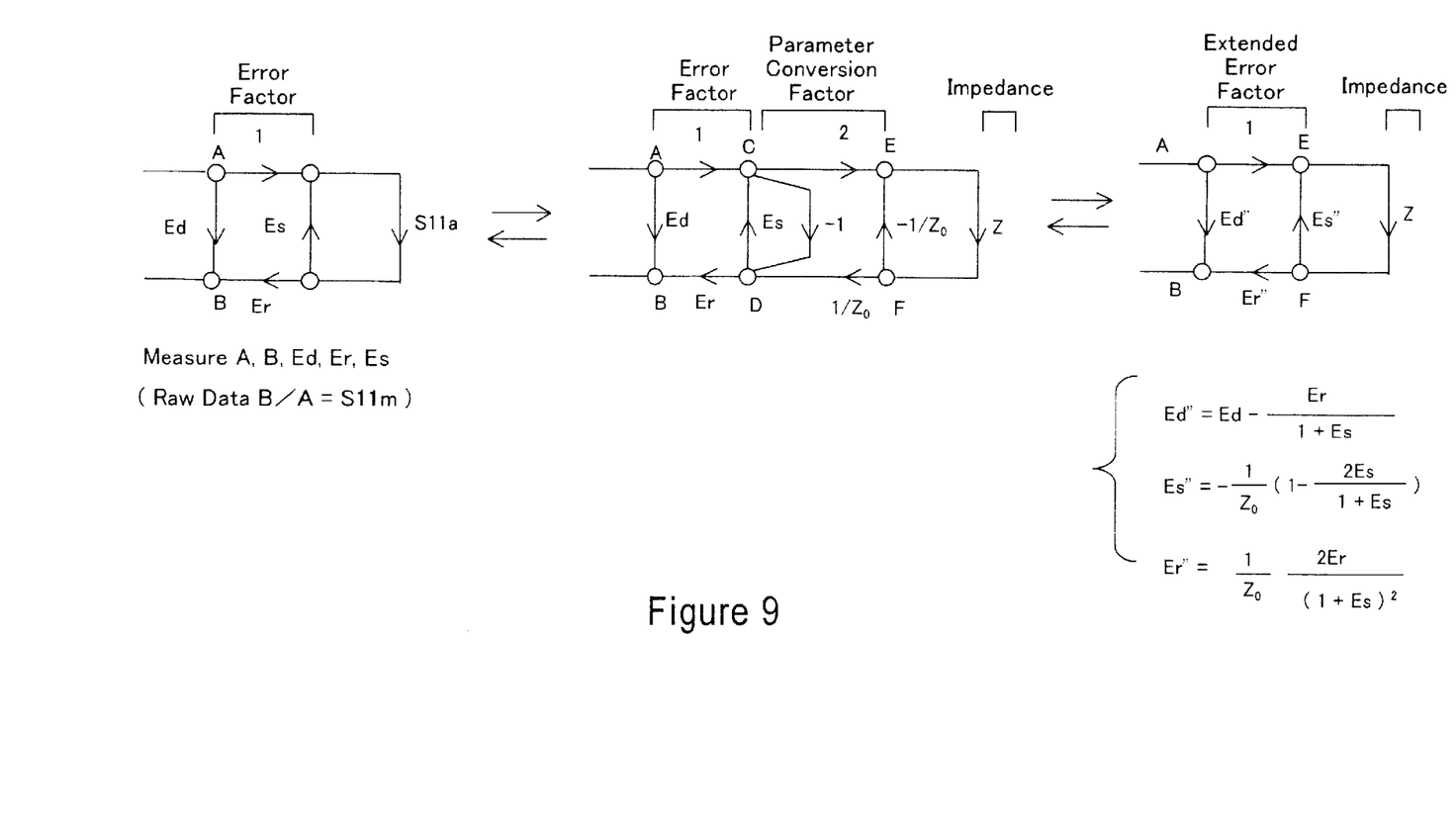
FIG. 9 is a signal flow graph giving an equivalent conversion of a device under test 20.

The measuring-system error factors and the device under test 20 can be expressed, as shown in the left-hand side of FIG. 9, by the combination of the error factors Ed, Er, and Es and the reflection coefficient S11a. Further, the same can be expressed, through the expression shown in the center of FIG. 9, as the combination of the impedance Z and the extended error factors Ed", Er", and Es" as shown in the right-hand side of FIG. 9. Since the extended error factors Ed", Er", and Es" are obtainable from the impedance Zo and the measuring-system error factors Ed, Er, and Es, the extended error-factor calculating portion 17 can obtain the extended error factors Ed", Er", and Es".

Finally, returning to FIG. 8, the device-under-test calculating portion 18 calculates the circuit parameter of the device under test 20 (the impedance Z in the case of the second embodiment) from the raw data (B/A) measured by the measuring portion 12 and the raw data measuring portion 13 and the extended error factors Ed", Er", and Es" calculated by the extended error-factor calculating portion 17 (Step 18).

Referring to FIG. 9, the impedance Z (F/E) can be obtained from the input and output (B/A) and the extended error factors, Ed", Er", and Es".

Also in the second embodiment, once the input and output (B/A) and the measuring-system error factors Ed, Er, and Es have been measured by the measuring portion 12, the raw data measuring portion 13, and the measuring-system error-factor measuring portion 14, the need for fabricating fixtures for obtaining the impedance Z when Zo is changed various ways and the need for repeating measurement many times exchanging one fixture with another can be eliminated and, hence, the circuit parameter can be measured simply.

Further, since the extended error factors Ed", Er", and Es" are previously obtained, the calculation can be performed quickly.

Although the circuit parameter is presumed to be an impedance Z in the second embodiment, it may be such as an S parameter as a given normalized impedance, an S parameter when a matching circuit is added, or a circuit admittance. Since the relationship between an S parameter as raw data with the measuring-system error factors Ed, Er, and Es eliminated therefrom and an S parameter as a given normalized impedance, and the like, is well-known, no particular description will be given here. Further, though an S parameter (including measuring-system error factors Ed, Er, and Es) is considered to be raw data, this may also be another circuit parameter (impedance or the like).

While, as described above, there are various types of raw data and circuit parameters, the relationship between data with measuring-system error factors eliminated therefrom, i.e., raw data from which measuring-system error factors are eliminated, and a circuit parameter is well-known, description thereof will be omitted.

According to the invention, since the circuit parameter of a device under test can be calculated without fabricating fixtures and without making measurements many times with the fixtures changed each time, it is made possible to calculate the circuit parameters simply.

What is claimed is:

1. A network analyzer for calculating a circuit parameter of a device under test comprising:
   a raw data measurement means for measuring raw data of said device under test;
   a measuring-system error-factor measurement means for obtaining measuring-system error factors occurring in the measurement of said device under test;
   a parameter conversion factor calculation means for obtaining factors of parameter conversion indicative of the relationship between said circuit parameter and measuring-system error-factor-free data obtained by eliminating said measuring-system error factors from said raw data;
   a true-value raw data calculation means for obtaining said measuring-system error-factor-free data from said raw data and said measuring-system error factors; and
   a device-under-test calculation means for obtaining said circuit parameter from said measuring-system error-factor-free data and said parameter conversion factor.

2. A network analyzer according to claim 1, wherein said measurement means treats said raw data as said measuring-system error-factor-free data.

3. A network analyzer for calculating a circuit parameter of a device under test comprising:
   a raw data measurement means for measuring raw data of said device under test;
   a measuring-system error-factor measurement means for obtaining measuring-system error factors occurring in the measurement of said device under test;
   a parameter conversion factor calculation means for obtaining factors of parameter conversion indicative of the relationship between said circuit parameter and measuring-system error-factor-free data obtained by eliminating said measuring-system error factors from said raw data;
   an extended error-factor calculation means for obtaining extended error factors by combining said measuring-system error factors and said parameter conversion factor; and
   a device-under-test calculation means for obtaining said circuit parameter from said raw data and said extended error factors.

4. A network analyzer according to claim 1, further comprising parameter conversion factor record means for recording said parameter conversion factor.

5. A network analyzer according to claim 1, wherein said circuit parameter is an impedance.

6. A network analyzer according to claim 1, wherein said circuit parameter is an S parameter as an arbitrary normalized impedance.

7. A network analyzer according to claim 1, wherein said circuit parameter is an S parameter when a matching circuit is added.

8. A network analyzer according to claim 1, wherein said circuit parameter is a circuit admittance.

9. A network analytical method of calculating a circuit parameter of a device under test comprising:
   a raw data measurement step for measuring raw data of said device under test;
   a measuring-system error-factor measurement step for obtaining measuring-system error factors occurring in the measurement of said device under test;
   a parameter conversion factor calculation step for obtaining factors of parameter conversion indicative of the relationship between said circuit parameter and measuring-system error-factor-free data obtained by eliminating said measuring-system error factors from said raw data;

a true-value raw data calculation step for obtaining said measuring system error-factor-free data from said raw data and said measuring-system error factors; and a device-under-test calculation step for obtaining said circuit parameter from said measuring-system error-factor-free data and said parameter conversion factor.

10. A network analytical method of calculating a circuit parameter of a device under test comprising:

a raw data measurement step for measuring raw data of said device under test;

a measuring-system error-factor measurement step for obtaining measuring-system error factors occurring in the measurement of said device under test;

a parameter conversion factor calculation step for obtaining factors of parameter conversion indicative of the relationship between said circuit parameter and measuring-system error-factor-free data obtained by eliminating said measuring-system error factors from said raw data;

an extended error-factor calculation step for obtaining extended error factors by combining said measuring-system error factors and said parameter conversion factor; and a device-under-test calculation step for obtaining said circuit parameter from said raw data and said extended error factors.

11. A computer-readable medium embodying a program of instructions for execution by the computer to perform a network analytical method of calculating a circuit parameter of a device under test comprising:

a raw data measurement step for measuring raw data of said device under test;

a measuring-system error-factor measurement step for obtaining measuring-system error factors occurring in the measurement of said device under test;

a parameter conversion factor calculation step for obtaining factors of parameter conversion indicative of the relationship between said circuit parameter and measuring-system error-factor-free data obtained by eliminating said measuring-system error factors from said raw data;

a true-value raw data calculation step for obtaining said measuring-system error-factor-free data from said raw data and said measuring-system error factors; and a device-under-test calculation step for obtaining said circuit parameter from said measuring-system error-factor-free data and said parameter conversion factor.

12. A computer-readable medium embodying a program of instructions for execution by the computer to perform a network analytical method of calculating a circuit parameter of a device under test comprising:

a raw data measurement step for measuring raw data of said device under test;

a measuring-system error-factor measurement step for obtaining measuring-system error factors occurring in the measurement of said device under test;

a parameter conversion factor calculation step for obtaining factors of parameter conversion indicative of the relationship between said circuit parameter and measuring-system error-factor-free data obtained by eliminating said measuring-system error factors from said raw data;

an extended error-factor calculation step for obtaining extended error factors by combining said measuring-system error factors and said parameter conversion factor; and a device-under-test calculation step for obtaining said circuit parameter from said raw data and said extended error factors.

13. A network analyzer for calculating a circuit parameter of a device under test comprising:

a raw data measurement device that measures raw data of said device under test;

a measuring-system error-factor measurement device that obtains measuring-system error factors occurring in the measurement of said device under test;

a parameter conversion factor calculation device that obtains factors of parameter conversion indicative of the relationship between said circuit parameter and measuring-system error-factor-free data obtained by eliminating said measuring-system error factors from said raw data;

a true-value raw data calculation device that obtains said measuring-system error-factor-free data from said raw data and said measuring-system error factors; and a device-under-test calculation device that obtains said circuit parameter from said measuring-system error-factor-free data and said parameter conversion factor.

14. A network analyzer for calculating a circuit parameter of a device under test comprising:

a raw data measurement device that measures raw data of said device under test;

a measuring-system error-factor measurement device that obtains measuring-system error factors occurring in the measurement of said device under test;

a parameter conversion factor calculation device that obtains factors of parameter conversion indicative of the relationship between said circuit parameter and measuring-system error-factor-free data obtained by eliminating said measuring-system error factors from said raw data;

an extended error-factor calculation device that obtains extended error factors by combining said measuring-system error factors and said parameter conversion factor; and a device-under-test calculation device that obtains said circuit parameter from said raw data and said extended error factors.

* * * * *